United States Patent [19]

Choi

[11] Patent Number: 5,467,356
[45] Date of Patent: Nov. 14, 1995

[54] BURN-IN CIRCUIT AND BURN-IN TEST METHOD

[75] Inventor: Yun-Ho Choi, Suwon, Rep. of Korea

[73] Assignee: Samsung Electronics Co., Ltd., Suwon, Rep. of Korea

[21] Appl. No.: 101,243

[22] Filed: Aug. 2, 1993

[30] Foreign Application Priority Data

Jul. 31, 1992 [KR] Rep. of Korea .................. 13818/92

[51] Int. Cl.[6] ............................................ G11C 29/00
[52] U.S. Cl. .............................. 371/21.1; 371/21.4
[58] Field of Search ............................ 371/21.1, 21.4, 371/28

[56] References Cited

U.S. PATENT DOCUMENTS

| | | | |
|---|---|---|---|
| 4,771,407 | 9/1988 | Takemae et al. | 365/226 |
| 5,051,955 | 9/1991 | Tobita | 371/21.1 |
| 5,077,738 | 12/1991 | Larson | 371/15.1 |
| 5,119,337 | 6/1992 | Shimizu et al. | 365/201 |
| 5,185,722 | 2/1993 | Ota et al. | 365/201 |
| 5,208,777 | 6/1993 | Shibata | 365/201 |
| 5,258,954 | 11/1993 | Furuyama | 365/201 |
| 5,276,647 | 1/1994 | Matsai et al. | 365/201 |

*Primary Examiner*—Robert W. Beausoliel, Jr.
*Assistant Examiner*—Norman M. Wright
*Attorney, Agent, or Firm*—Charles R. Donohoe; Stephen R. Whitt

[57] ABSTRACT

A burn-in enable circuit and burn-in test method of a semiconductor memory device are disclosed. A high voltage exceeding the external power voltage by a predetermined amount is applied to at least one of a plurality of pins normally used with a connected semiconductor memory chip to initiate a burn-in test mode. The burn-in test enable circuit senses this high voltage and causes the reset operation of word lines in the chip to become disabled. This allows for a high stress voltage to be applied to all access transistors in the chip simultaneously during a burn-in test for substantially the same amount of time. Therefore, burn-in time is substantially reduced and a reliable burn-in test is obtained.

9 Claims, 3 Drawing Sheets

BURN-IN CIRCUIT AND BURN-IN TEST METHOD

BACKGROUND OF THE INVENTION

1. Field of the Invention

The present invention relates to a burn-in test method for use in a semiconductor memory device, and more particularly to a circuit and method for performing the burn-in test.

2. Background of the Related Art

Semiconductor devices are liable to process defects and other problems. The ratio of defects also increases in proportion to the integration density of the semiconductor chip.

It is also well known, as the integration density of semiconductor chips increase, the size of each of the transistors contained within becomes smaller.

Therefore, if the applied external D.C. power voltage is applied to the transistor of reduced size without correspondingly lowering the applied D.C. power voltage, effects of the electrical field are increased, thereby causing more defects in the transistor.

In order to ensure the reliability of memory chips, it is well known in the art to perform a burn-in test after the chip is fabricated to detect defective memory cells. The burn-in test applies a voltage exceeding the external power voltage to the gate of memory cell transistors at a high temperature for a long time in order to detect defective memory cells within the chip. This excessive stress helps to easily detect the defects.

A conventional burn-in test method will now be described in detail with reference to a memory chip. In known dynamic RAMs (Random Access Memory), only a given word line can be set to logic "high" during one row address strobe RAS cycle. Thus, a plurality of rows are sequentially enabled to logic "high". FIG. 1 illustrates the overall chip architecture of a 4 Meg DRAM. The memory cell array of the illustrated 4 Meg DRAM is arranged in a matrix of four subarrays each having 1024 rows. The 1024 rows of each subarray are sequentially enabled to logic "high" from a first row. Specifically, if one row address strobe signal RAS is applied with an active signal, respective first rows of memory cell arrays 1M, 1M', 1M" and 1M'" are set to logic "high", and if the row address strobe signal RAS is applied with a precharge signal, respective first rows of the memory cell arrays 1M, 1M', 1M" and 1M'" are reset. Thereafter, if the row address strobe signal RAS is again applied with the active signal, respective second rows of the memory cell arrays 1M, 1M', 1M" and 1M'" are set to logic "high". This process is repeated for all 1024 rows and by so doing, all the cell arrays are sequentially set to logic "high", to perform the burn-in test.

If a burn-in time of 72 hours (this time is variable according to the characteristics of the chip) is selected, the stress of the high voltage is applied to each access transistor for about 4.2 minutes total.

However, as the number of memory cells in the chip increase, the above-described burn-in test method requires increasing the total burn-in time. In a 16 Meg DRAM, for instance, in order to give the stress time of 4.2 minutes per access transistor, a burn-in time of 288 hours (72×4) is needed, and in the case of a 64 Meg DRAM, a burn-in time of 576 hours (72×8) is required. Consequently, it takes a long time to complete a burn in test of a single memory chip. Moreover, with this known technique, it is still difficult to consider burn-in test effective because 4.2 minutes of burn-in time is not enough to ensure the reliability for a complete burn-in test. However, in order to increase this time in any significant manner, the overall test time must increase substantially.

SUMMARY OF THE INVENTION

It is therefore an object of the present invention to provide a semiconductor memory device capable of efficiently performing a burn-in test within a minimum time.

It is another object of the present invention to provide a burn-in test method for semiconductor a memory device capable of performing a reliable burn-in test within a minimum amount of time.

It is an additional object of the present invention to provide a semiconductor memory device capable of effectively applying stress to all memory cell arrays during a given time.

It is a further object of the present invention to provide a burn-in test method of a semiconductor memory device that effectively applies stress to all cell arrays during a given time.

In accordance with one aspect of the present invention, a burn-in test method of a semiconductor memory device includes the steps of: generating a burn-in enable signal when a high voltage over an external power voltage is applied to a specific pin among a plurality of pins connected to a chip; enabling a first word line by the input of a row address synchronizing with the first input of a row address strobe signal; continuously maintaining an address strobe signal; continuously maintaining an enable operation of the first word line by the burn-in enable signal; enabling a second word line from the input of the row address synchronizing with the second input of the row address strobe signal; and disabling the first and second word lines by a converted burn-in enable signal when a voltage under the external power voltage is applied to the specific pin.

In accordance with another aspect of the present invention, a semiconductor memory device has a word line driver for receiving a row address synchronizing with a row address strobe signal and a precharge reset signal, to enable a given word line. This aspect comprises a burn-in enable circuit for generating a burn-in enable signal of a first voltage level when a high voltage over an external power voltage is applied to a specific pin of a chip; and a word line driver reset circuit for receiving a row address master clock converted to an internal signal by the row address strobe signal and the burn-in enable signal. The input of the row address strobe signal is disabled when the burn-in enable signal of the first level signal is applied. A burn-in test for all cell transistors in a memory cell array is performed while the burn-in enable signal is generated to the first level.

BRIEF DESCRIPTION OF THE DRAWINGS

The advantages and features of the present invention will become apparent from the following detailed description with reference to the attached drawings, in which.

DETAILED DESCRIPTION OF THE PREFERRED EMBODIMENT

Figure 1:
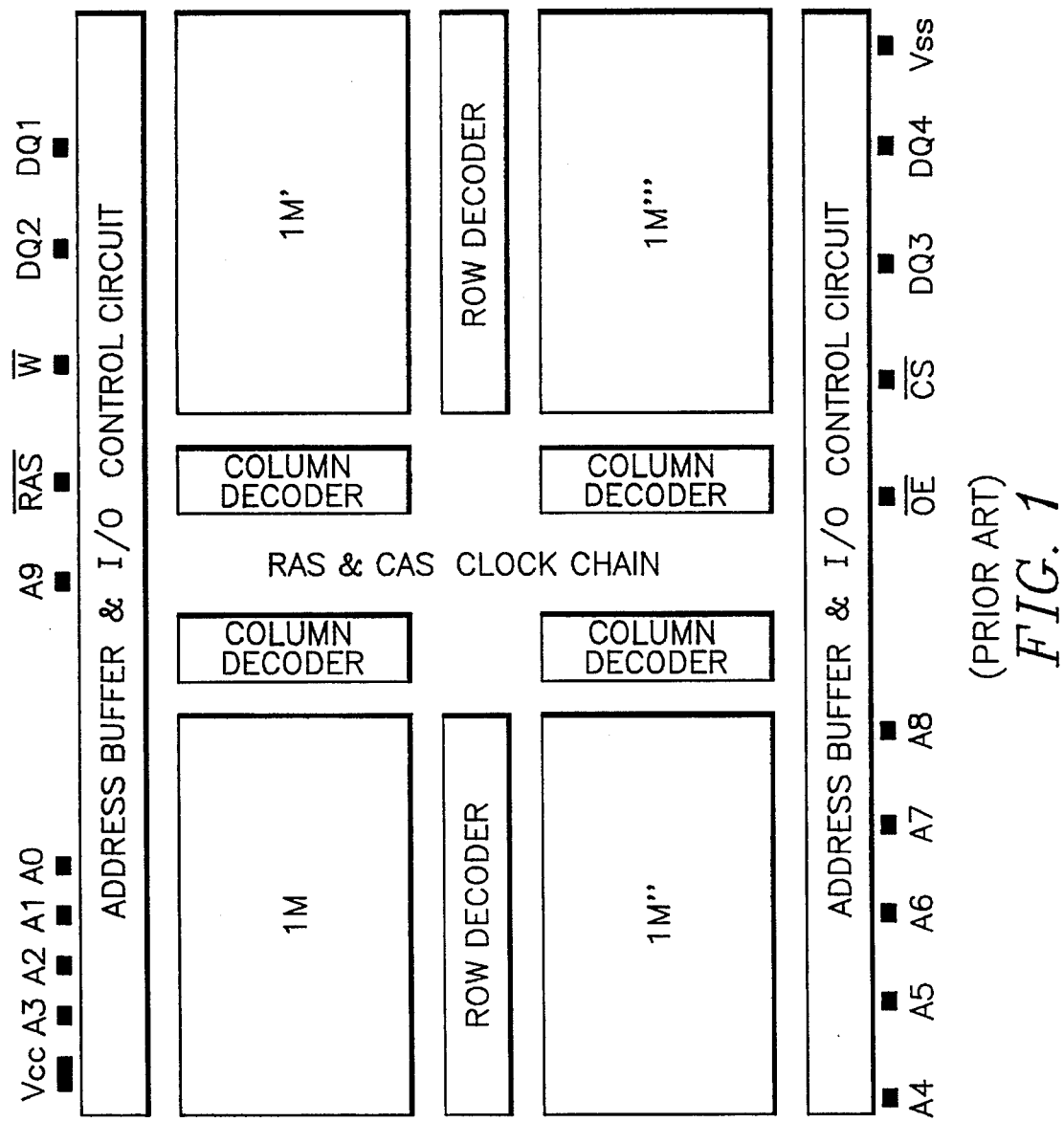
FIG. 1 illustrates a prior art chip architecture of a Mega DRAM.

In a preferred embodiment of the invention, once a word line is enabled, the word line maintains the enabled state irrespective of other enabled word lines until a burn-in enable signal is disabled.

An overall description of the operation method will be provided before describing the specific new ciruits needed to implement this burn-in test method.

A burn-in voltage sensing circuit in the chip is connected to a pin among the plurality of pins of the chip. The burn-in voltage sensing circuit senses a burn-in test mode when an external high voltage greater than the normal operating external power voltage is applied to this pin. If the burn-in test mode is sensed, the burn-in voltage sensing circuit generates a burn-in enable signal øBE. The burn-in enable signal is continuously generated while the external high voltage is applied to the pin. If the level of the external high voltage applied to the pin falls below a predetermined voltage level, the burn-in enable signal is not generated.

During a burn-in operation, each word line is enabled according to a row address synchronized with the row address strobe signal RAS. This operation is performed by a word line driver to which the row address is applied. In order to apply a stress voltage to a first row in a memory cell array, the row address designating the first row is applied and synchronized with a first row address strobe signal RAS and, a first word line corresponding to the first row is enabled. After the first word line corresponding to the first row is enabled, the row address strobe signal RAS is reset first to a precharge signal, and then set to an active signal. However, even when the row address strobe signal RAS is reset for precharge, the first word line enable is continuously maintained. This occurs because the burn-in enable signal øBE inhibits resetting the word line driver. Thus the first word line driver operates continuously after being initially enabled until the burn-in signal is turned off.

After the row address strobe signal RAS is reset for precharge, the row address strobe RAS is then again applied, this time synchronized with the application of the second row address and a second word line corresponding to the second row which is thus enabled. During this time, the first and second word lines are simultaneously enabled.

In order to apply the stress voltage to a third row in the memory cell array, the row address strobe signal RAS is again reset to the precharge signal, and again set to the active signal. Similarly, during this precharge reset of the row address strobe signal RAS, the first and second word lines are continuously enabled. The third row address is then synchronized with another active row address strobe signal RAS to enable the word line corresponding to the third row. During this time, the first, second and third word lines are simultaneously enabled.

Thus, the stress voltage is sequentially applied to all the word lines in the memory cell array, and once a word line is enabled, the word line maintains its state until the burn-in test is terminated.

In the described burn-in test method, the overall required burn-in test time is considerably reduced, while the stress voltage applied to each memory cell transistor is considerably increased in comparison to the prior art, thereby remarkably improving the efficiency and reliability of the burn-in test.

Figure 2:
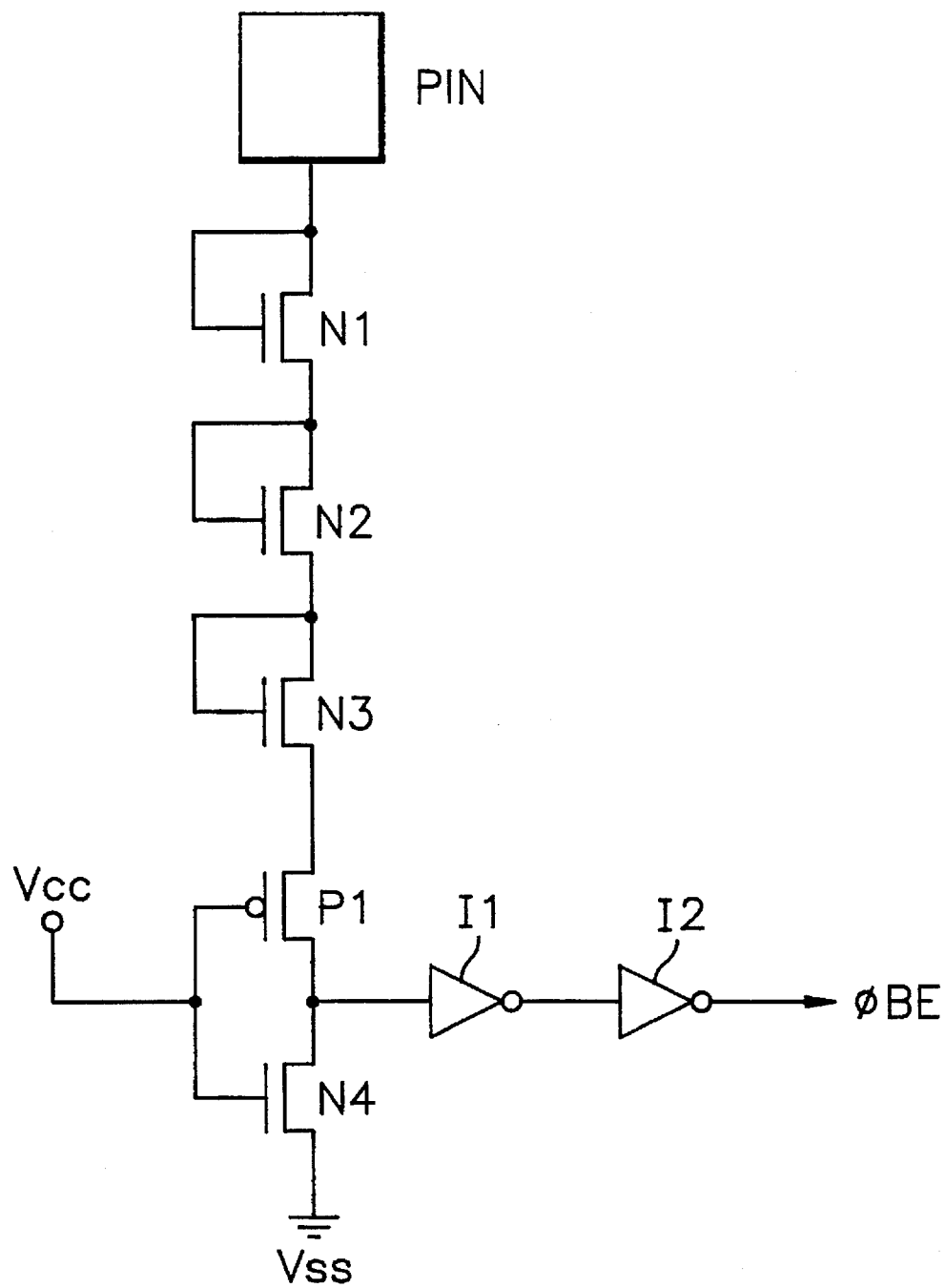
FIG. 2 is a circuit diagram of a burn-in enable circuit according to the present invention.

In order to perform the burn-in test as described above, circuitry for sensing a burn-in test mode is required. This circuit must be able to sense the high external voltage applied to a specific pin. The preferred pin is a pin to which an address is not applied and which is not normally used during the burn in test. This burn-in enable circuit is shown in FIG. 2.

As shown, the burn-in enable circuit contains a CMOS pullup circuit. PMOS transistor P1 and NMOS transistor N4 are connected together source to drain, and the gate of each transistor P1, N4 is connected to power voltage terminal Vcc. Diodes N1, N2 and N3 formed of three NMOS transistors are connected serially and are disposed between the specific pin PAD of the chip and the pullup terminal made of transistors P1 and N4. Driver inverters I1 and I2 are driven by the output of the CMOS pullup and generating a burn-in enable signal øBE.

During normal operation, since the external voltage level applied to the pin PAD ranges from −1 V to (Vcc+1 V), the logic state of the output of the driver circuit I1 and I2 is logic "low" and the burn-in enable signal øBE does not occur. However, during the burn-in test, if the external voltage exceeds "Vcc+3 Vtn+Vtp" where 3 Vtn is the combined threshold voltage of the diodes N1, N2 and N3, and Vtp is the threshold voltage of the pull-up transistor P1) is applied to the specific pin PAD, the pull-up transistor P1 of the CMOS pullup circuit is turned on to thereby generate the burn-in enable signal øBE of logic "high".

Figure 3:
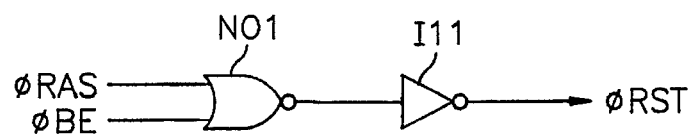
FIG. 3 illustrates a word line driver reset circuit according to the present invention.
Figure 4:
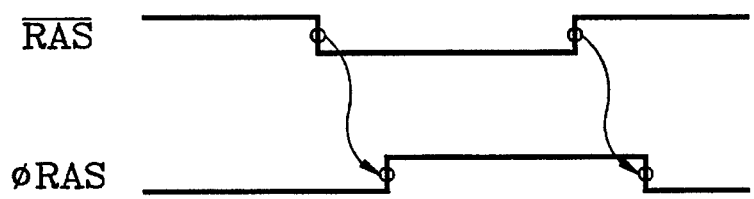
FIG. 4 is a timing diagram.

As shown in FIG. 3, a reset clock generating circuit for preventing all the word lines from resetting consists of a NOR gate NO1 with two inputs for receiving row address master clock signal øRAS and the burn-in enable signal øBE, and an inverter I11 connected by its input to the output of the NOR gate NO1. The signal øRAS is an internally generated signal obtained but delayed from the row address strobe signal RAS, as illustrated in the timing diagrams of FIG. 4.

The output of the inverter I11 is a word line driver reset signal øRST that enables and disables the word line. If the burn-in enable signal øBE is not enabled and at a logic "low" the reset signal øRST has the same phase with the row address master clock signal øRAS and is to be of logic a "low" level during precharge cycles of the row address strobe signal RAS, thereby resetting the word line driver. However, if the burn-in enable signal øBE of logic "high" exists the reset signal øRST is maintained at a logic "high" level and the word line driver is not reset during the precharge cycle of the row address strobe signal RAS.

The word line driver according to the present invention may be easily performed with a word line driving circuit as disclosed in Korean Patent Application No. 91-20828, filed Nov. 21, 1991, assigned to the same assignee as the present invention.

Figure 5:
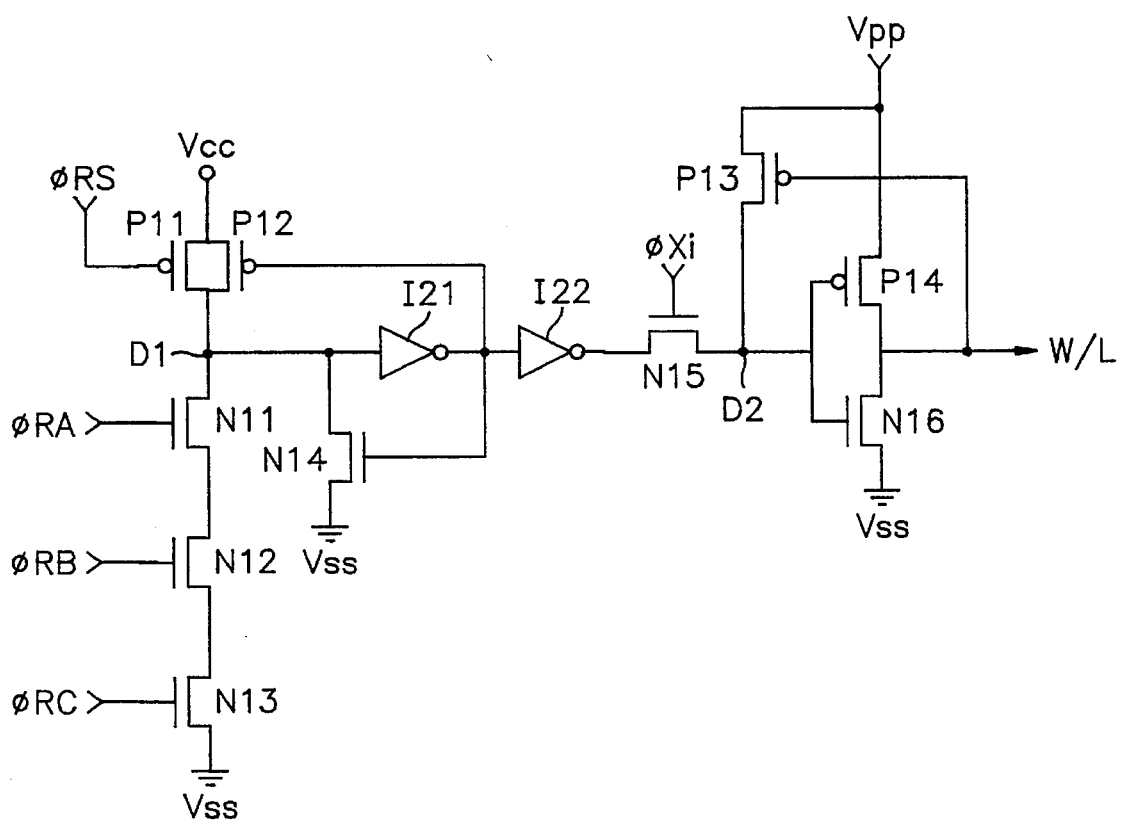
FIG. 5 is a circuit diagram of a word line driver according to the present invention.

Referring to FIG. 5, if the reset signal øRST of logic "high" is applied to pull-up PMOS transistor P11, then the first node D1 becomes logic "low". As a result, the state of second node D2, which drives the word line W/L, becomes logic "low". Signals øRA øRB and øRC are decoding signals of the row address and a signal øXi is a word line boosting signal. Therefore, while the reset signal øRST of logic "high" is supplied, the word line W/L is continuously enabled at a logic "high". In this case, a voltage Vpp is applied to the word line W/L and is maintained at a logic "high" level by a charge pump circuit driven by a ring oscillator in the chip as is known in the art.

Once a word line is enabled, the wordline W/L is maintained at logic "high" level until the burn-in enable signal øBE becomes a logic "low" level.

When the row address signal designating the last row in the memory cell array is applied, all the word lines of the chip are enabled to logic "high". The logic state of all word lines W/L thus enabled to logic "high" become logic "low" when the burn-in enable signal øBE is no longer generated.

As can be appreciated from the foregoing description, by activating all the word lines in one memory cell array at substantially the same time, the burn-in time becomes equal to the stress time. Hence, the burn-in test is implemented within a short time, and simultaneously, a reliable burn-in test is ensured.

While a preferred embodiment of the present invention has been particularly shown and described, it will be understood by those skilled in the art that foregoing and other changes in form and details may be made without departing from the spirit and scope of the present invention.

For example, in the FIG. 2 circuit the number of diodes may be adjusted and the burn-in enable signal may be generated using any one pin other than address input pins of the chip.

Also, it is also possible to use two difference burn-in enable generator circuits, attached to different address pins, and then have the øBE lines connected together, so that the high voltage external signal, which will also be detected as an address signal, can always be generated while still allowing all the different address combinations to be included.

Another alternative, of course, is to use another separate pin to input a øBE signal. In this instance, the burn-in enable generator circuit of FIG. 2 would not be needed.

What is claimed:

1. A method of burn-in testing a semiconductor memory device having a plurality of pins and a plurality of word lines comprising the steps of:

generating a burn-in enable signal by applying a voltage greater than an operating voltage of said device to a predetermined pin of said semiconductor;

enabling a first word line by synchronizing a first row address with a first input of a row address strobe signal;

preventing a word line driver reset operation using said burn-in enable signal;

enabling a second word line by synchronizing a second row address with a second input of a row address strobe signal; and disabling said first and second word lines by disabling said burn-in enable signal.

2. A burn-in test method according to claim 1, wherein said predeteremined pin is a pin to which an address signal is not applied.

3. A burn-in test method of a semiconductor memory device having a plurality of pins, a memory cell array including first, second, third, to nth word lines, and a plurality of corresponding word line drivers for receiving a row address decoding signal and a reset signal, said method comprising the steps of:

generating a burn-in enable signal by applying a voltage greater than an operating voltage of said device to a predetermined pin of said semiconductor;

preventing a word line driver reset operation using said burn-in enable signal;

enabling a first word line using a first row address synchronized with a first input of a row address strobe signal;

enabling a second word line using a second row address synchronized with a second input of said row address strobe signal while said first word line is enabled;

enabling a third word line using a third row address synchronized with a third input of said row address strobe signal while said first and second word lines are enabled; and sequentially enabling each increasing word line including said nth word line using a corresponding row address and a subsequent row address strobe signal while still enabling said previously enabled word lines; and continuing to enable all of said word lines for a predetermined time in order to complete said burn-in test.

4. A semiconductor memory device having a plurality of pins, a plurality of word line drivers for each receiving a row address signal synchronized with a row address strobe signal to enable a given word line, and a precharge reset signal to reset said given word line, said device comprising:

a memory cell array having a plurality of memory storage locations, each of said plurality of memory storage locations including a memory cell transistor coupled to one of said word lines;

a burn-in enable circuit connected to a first pin of said semiconductor memory device for generating a burn-in enable signal of a first voltage level when a voltage greater than an operating voltage of said device is applied to said first pin; and a word line driver reset circuit for resetting said given word line when said precharge reset signal is input, said word line driver reset circuit further inputting a word line driver reset signal that is derived from said row address strobe signal and said burn-in enable signal such that said word line driver reset circuit does not reset said given word line when said word line driver reset signal is present so that a burn-in test of all of said memory cell transistors in said memory cell array can be performed simultaneously while said burn-in enable signal is generated.

5. A semiconductor memory device according to claim 4, wherein said burn-in enable circuit comprises:

a CMOS pullup circuit having a pull-up node and having a control terminal connected to a power voltage terminal;

a plurality of diodes serially connected between said first pin of said semiconductor memory device and said pull-up node of said CMOS pullup circuit; and a circuit for generating said burn-in enable signal, said circuit for generating being driven by an output of said CMOS pull-up circuit.

6. A semiconductor memory device according to claim 4, wherein said word line driver reset circuit comprises an OR circuit having a first input connected to a row address master clock signal derived from said row address strobe signal and a second input connected to said burn-in enable signal.

7. A semiconductor memory device according to claim 5, wherein said word line driver reset circuit comprises an OR circuit having a first input connected to a row address master clock signal derived from said row address strobe signal and a second input connected to said burn-in enable signal.

8. A semiconductor memory device having a plurality of pins, a plurality of word line drivers for each receiving a row address signal synchronized with a row address strobe signal to enable a given word line, and a precharge reset signal to reset said given word line, said device comprising:

a memory cell array having a plurality of memory storage locations, each of said plurality of memory storage locations including a memory cell transistor coupled to one of said word lines;

a burn-in enable circuit connected to a first pin of said semiconductor memory device for generating a burn-in enable signal; and a word line driver reset circuit for resetting said given word line when said precharge reset signal is input, said word line driver reset circuit further inputting a word line driver reset signal that is derived from said row address strobe signal and said burn-in enable signal such that said word line driver reset circuit does not reset said given word line when said word line driver reset signal is present so that a burn-in test of all of said memory cell transistors in said memory cell array can be performed simultaneously while said burn-in enable signal is generated.

9. A semiconductor memory device according to claim 8, wherein said burn-in enable circuit comprises:

a CMOS pullup circuit having a pull-up node and having a control terminal connected to a power voltage terminal;

a plurality of diodes serially connected between said first pin of said semiconductor memory device and said pull-up node of said CMOS pullup circuit; and a circuit for generating said burn-in enable signal, said circuit for generating being driven by an output of said CMOS pull-up circuit.

* * * * *